US007284182B2

(12) United States Patent
Raahemi

(10) Patent No.: US 7,284,182 B2
(45) Date of Patent: Oct. 16, 2007

(54) ERROR CORRECTION ON M-BIT ENCODED LINKS

(75) Inventor: Bijan Raahemi, Ottawa (CA)

(73) Assignee: Alcatel, Paris (FR)

( * ) Notice: Subject to any disclaimer, the term of this patent is extended or adjusted under 35 U.S.C. 154(b) by 883 days.

(21) Appl. No.: 10/629,690

(22) Filed: Jul. 30, 2003

(65) Prior Publication Data

US 2005/0028066 A1 Feb. 3, 2005

(51) Int. Cl.
*H03M 13/00* (2006.01)
(52) U.S. Cl. .................. 714/758; 714/781; 714/753; 714/807
(58) Field of Classification Search ................ 714/781, 714/753, 758, 807
See application file for complete search history.

(56) References Cited

U.S. PATENT DOCUMENTS

| 5,491,700 | A | 2/1996 | Wright et al. | |
|---|---|---|---|---|
| 5,881,074 | A | 3/1999 | Rao | |
| 6,088,827 | A | 7/2000 | Rao | |
| 7,020,833 | B2 * | 3/2006 | Watanabe et al. | 714/798 |
| 7,089,485 | B2 * | 8/2006 | Azadet et al. | 714/798 |

OTHER PUBLICATIONS

J.Carlson et al: "RFC 2823: PPP over Simple Data Link (SDL) Using SONET/SDH with ATM-like Framing," Network Working Group Request for Comments, 2823, May 2000 (pp. 1-28).

Sowmya S. Luckoor: "Introduction to 10 Gigabit 64b/66b (Clause 49)," Internet Article, Oct. 22, 2001: URL:http://www.iol.unh.edu/knowledgeBase/training/files/10gec/10GbE_C149.pdf>.
IEEE Computer Society: "802.3AE: IEEE Standard for Information Technology—Telecommunications and Information exchange between systems—Local and metropolitan area networks—Specific requirements: Part 3: Carrier Sense Multiple Access with Collision Detection (CSMA/CD) Access Method and Physical Layer Specifications." IEEE STANDARDS, Aug. 30, 2002, New York, NY.
Steve Linton: "Error-correcting Codes," Internet Article, Nov. 28, 1995: URL:http://www.dcs.sta- and.ac.uk/{sal/schoo1/cs3010/Lectures/forhtml/node3.html#SECTION00030000000000000000>.

* cited by examiner

*Primary Examiner*—Guy Lamarre
*Assistant Examiner*—Esaw T. Abraham
(74) *Attorney, Agent, or Firm*—Jim Zegeer

(57) ABSTRACT

Error correction on high speed interconnection links—backplane or extended wires (cable, optical fiber)—is exhaustively considered by many telecommunication vendors, especially those who offer "scalable router" products. Since the 64b/66b encoding scheme is a strong candidate of high speed interconnection protocol, error correction on 64b/66b encoded links is of interest. Although the IEEE 802.3 10G Ethernet standard does not specifically refer to packet loss, it can be shown that even only a single-bit error correction can significantly enhance the quality of the link. The present invention presents a simple and fast error-correction scheme that can be used in conjunction with the 64b/66b encoding in products where intra-board (chip-to-chip) or inter-shelf interconnections of high speed elements are required. It utilizes the CRC16 to optimize on error detection, correction, or both: it detects and corrects all single-bit errors and detects all multiple-bit errors.

5 Claims, 5 Drawing Sheets

Functional Block Diagram of the PCS layer in 10GBASE-R Ethernet PHY.

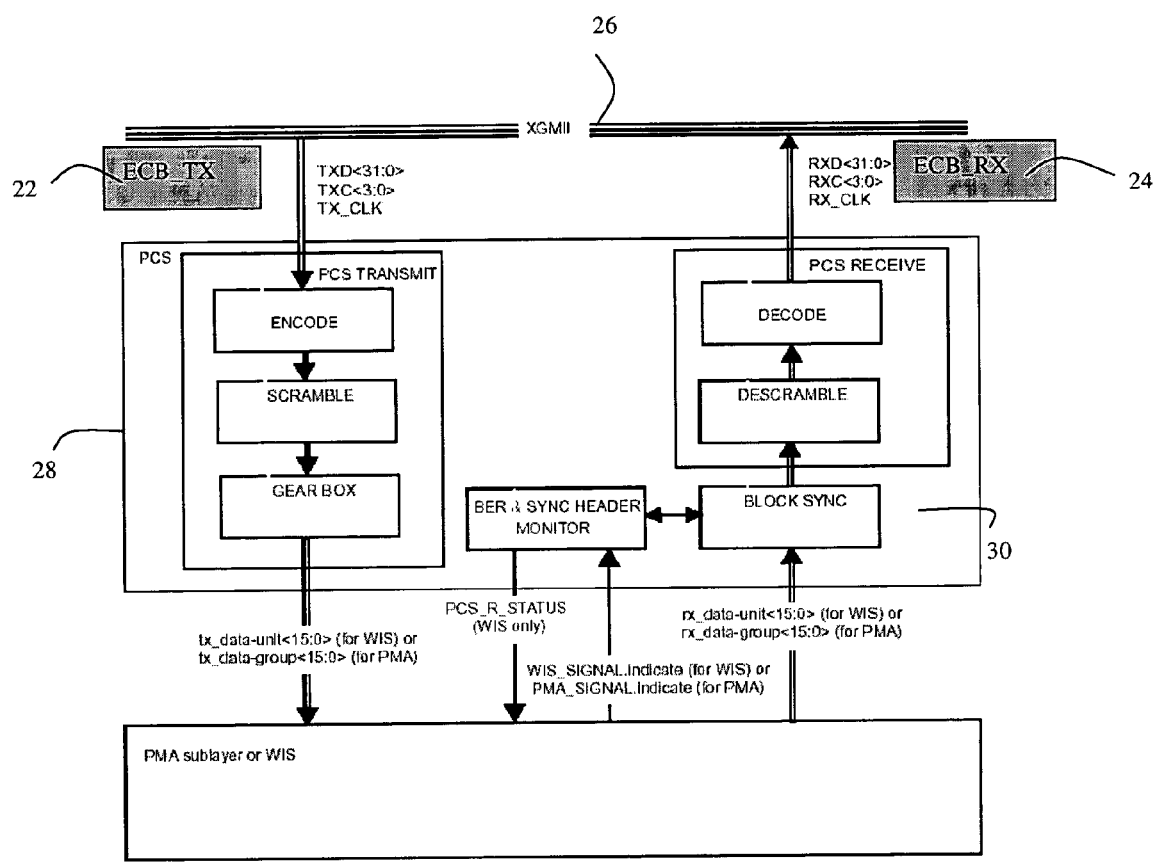
Figure 1: Functional Block Diagram of the PCS layer in 10GBASE-R Ethernet PHY.

Data Codewords have "01" sync preamble
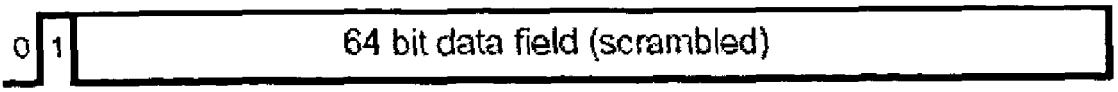
Mixed Data/Control frames are identified with a "10" sync preamble. Both the coded 56-bit payload and TYPE field are scrambled
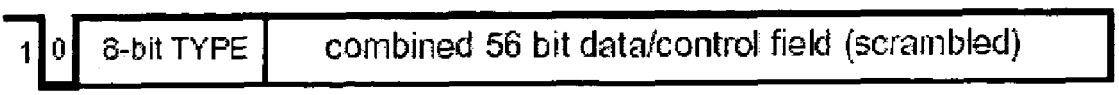
Figure 2: 64b/66b code words.

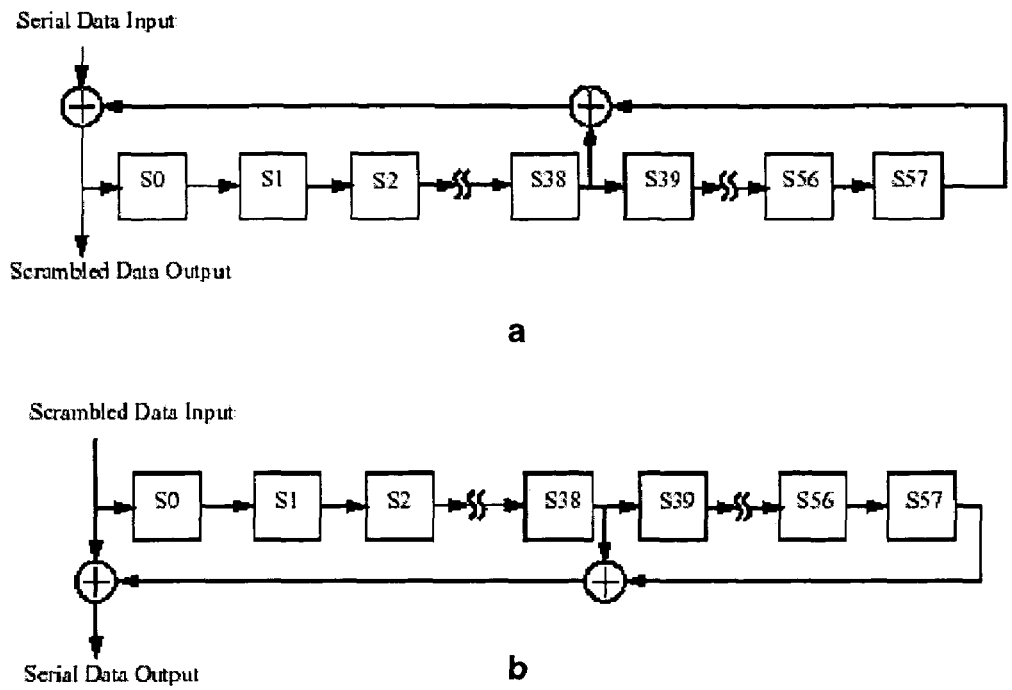
Figure 3: The self-synchronous scrambler and descrambler used in 64b/66b encoding.
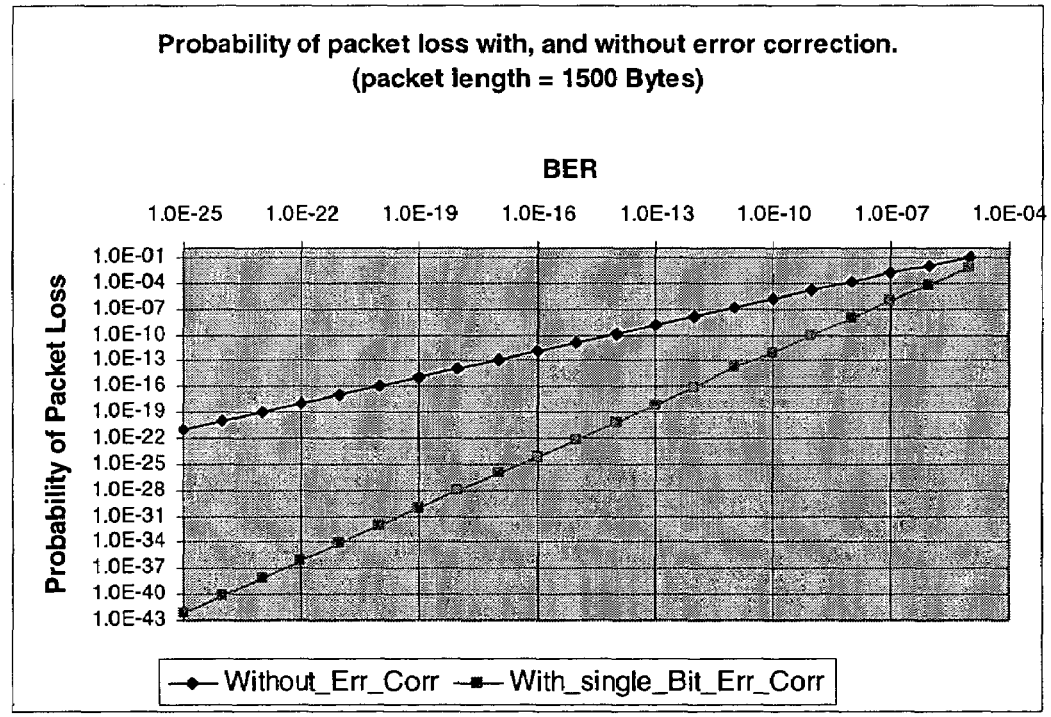
Figure 4: Probability of packet loss with, and without single-bit error correction.

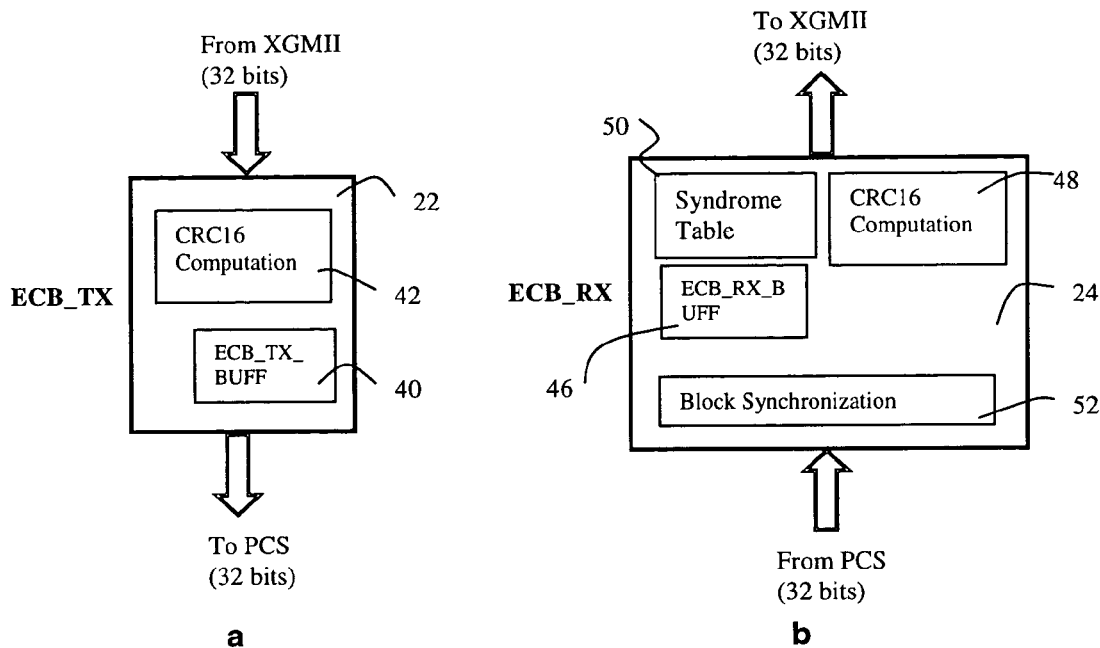
Figure 5: Functional block diagram of the Error Control Blocks (ECB).
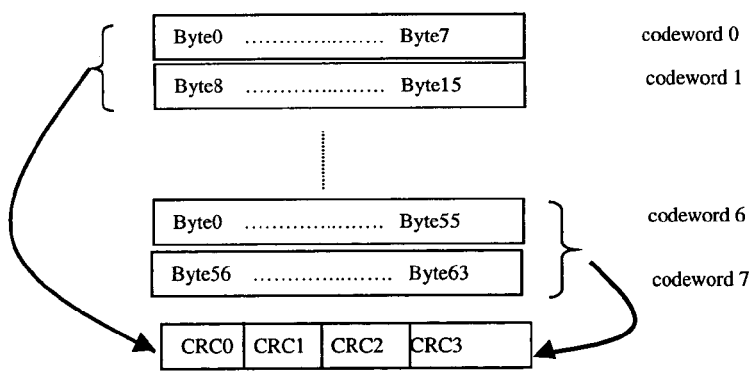
Figure 6: The buffer format in the ECB_RX and ECB_TX modules.

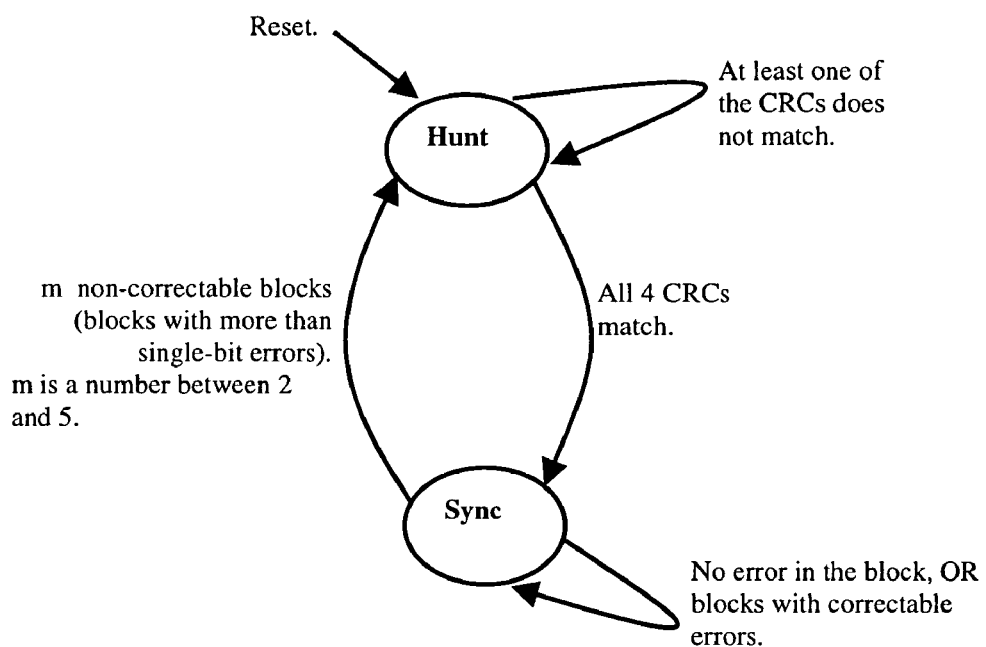
Figure 7: The state diagram of the block synchronization in the ECB_RX module.

ERROR CORRECTION ON M-BIT ENCODED LINKS

FIELD OF THE INVENTION

This invention relates in general to error-correction and more particularly to a simple and fast error correction scheme that can be used in conjunction with M-bit encoding in products where interconnections of high speed elements are required.

BACKGROUND OF THE INVENTION

In search of a low overhead and efficient line encoding, the IEEE task force has recently introduced a 64b/66b encoding scheme for 10 Gigabit Ethernet, which, with only 3.125% overhead, provides an acceptable level of transmission density and run length. The new scheme has been modified and accepted into the IEEE 802.3 Standard of 10 Gigabit Ethernet (IEEE802.3ae).

Providing an acceptable level of transmission density at a low overhead cost, the 64b/66bencoding is a strong candidate for high speed inter-shelf, chip-to-chip, and backplane interconnections. However, interconnection of high speed elements via the backplane or extended wires (cable, optical fiber) requires close attention to error handling, especially at bit rates of multiple Gbps.

Unlike its predecessor (8b/10b encoding), the 64b/66bencoding is not a mapping of 64b data words to predefined 66-bit code words. In fact, 64b/66b encoding uses scrambling. Each 64-bit data word is scrambled using a self-synchronous scrambler, which has a polynomial of the form: $x^{58}+x^{39}+1$. Then, a two bit preamble is added to the scrambled code word. If the codeword contains data characters only, the two-bit preamble is "01." If the codeword contains data characters as well as control characters, the preamble bits are "10" (FIG. 2). Preambles "00" and "11" are considered code errors and cause the packet to be invalidated.

Attributable to the presence of preamble bits ("01" or "10"), the run length is deterministically (i.e., guaranteed to be) less than 64,which is well below the SONET/SDH requirement of run length of 72.

One of the problems associated with the 64b/66b encoding scheme is that there is no provisioning of error corrections on 64b/66b encoded lines. It can be shown that even a single-bit error correction can significantly enhance the link quality. It has also been shown that the use of CRC16 over 8 bytes of the SDL (single data link) header is unique enough to correct single-bit errors. Furthermore, there has been no proposal of using CRC16 when the errors might be duplicated, for instance, in the presence of a self-synchronous scrambler.

The new 64b/66b encoding is based on a self-synchronous scrambler; therefore, it duplicates the errors occurring on the transmission line. The following paragraphs will make clear how a self-synchronous scrambler duplicates errors.

The polynomial of the self-synchronous scrambler is of the form $x^{58}+x^{39}+1$. FIG. 3 shows a serial implementation of the scrambler. (This scrambler can also be implemented in parallel such that in one clock cycle all 64 bits are scrambled.)

In a self-synchronous scrambler, the receiver scrambler will be in sync with the transmitter scrambler after, at most, 58 bits of data has passed through the scrambler. This scrambler is extremely hard to attack since the initial state of the scrambler is unknown to a malicious user. A self-synchronous scrambler has four advantages: simplicity, very fast synchronization, robustness against false synchronization, and robustness against emulation attacks. The disadvantage is that it duplicates the error. Every transmission error will result, after descrambling, in two additional errors—namely, 39 and 58 bit periods after the original error. This is because the $x^{58}+x^{39}+1$ descrambler consists of a 58-bit shift register whose input is fed by the received data.

Upon reception, the original error proceeds through the "scrambled data input" of the XOR gate and, at the same time, is fed into the shift register (FIG. 3). That error will propagate through the shift register and 39 bit periods later will show up at the input to the XOR gate. The corresponding received data bit at the "data" input of the XOR gate will be summed modulo-2 with the error to produce a second error—the first additional error. The same thing happens when the original error propagates through the shift register and shows up 58 bit periods later at the input to the XOR gate; this produces a third error or the second additional error. The error multiplication is now complete. There are no further errors generated by that original transmission error because the output of the XOR gate is not fed back to the descrambler. Only the scrambler has feedback.

Although 64b/66b encoding is an efficient line encoding scheme, associated with it are drawbacks and problems that can not be ignored:

(a) Transmission at high bit rates (multiple Gbps) over copper or fiber links requires close attention to error handling. The 64b/66b encoding does not provision for single- or multiple-bit error correction.

(b) Furthermore, the self-synchronous scrambler deployed in 64b/66b encoding duplicates errors. By duplicating errors and—as mentioned in (a)—not provisioning for them, the problem is intensified. Consequently, a simple error correction scheme is not sufficient in 64b/66bencoders.

(c) Also, it is not verified that the strength of CRC16 does not grow weaker over longer blocks, and that it would still be competent enough to correct all patterns of single-bit errors over these longer blocks.

FIG. 4 shows the probability of packet loss for various BERs (bit error rates) with and without error correction. The packet length is assumed as 1500 bytes—that is, Ethernet max packet size. As shown in this figure, with BER of $10^{-12}$ (a typical bit error rate mentioned in standards and data sheets), the probability of packet loss without error correction is 1.2e-8.With single-bit error correction, this probability drops to 7.2e-17.If this level of packet loss were to be achieved without doing single-bit error correction, a bit error rate of 1e-20 would have been required. This represents a significant improvement in link quality (from BER of $10^{-12}$ to $10^{-20}$).

A CRC16 can detect and correct all single-bit errors. Also, it can detect double-bit errors, all errors with an odd number of bits, all burst error of length 16 or less, 99.997% of 17-bit error burst, and 99.998% of 18-bit and longer bursts.

Accordingly, a more reliable error correction scheme that corrects all patterns of single-bit errors while provisioning multiple-bit errors is desirable.

SUMMARY OF THE INVENTION

To improve on the limitations of the prior art described above, the present invention accordingly provides provision for error correction on M-bit encoded lines.

An advantage of the present invention is that it provides a single-bit error correction over 64b/66b encoded links; it has been shown that a single-bit error correction can significantly enhance the quality of the link.

A further advantage of the invention is that it presents way to take into account the error multiplication effect of self-synchronous scramblers, which are deployed in the IEEE 802.3 10Gb Ethernet.

Still, an additional advantage of the invention is that it is 64-bit aligned; this makes it compatible with the structure of 10GbE defined in the IEEE 802.3.

Moreover, an advantage of this invention is that it is general and applicable to other encoding schemes with self-synchronous scrambler regardless of the polynomial of the scrambler and the polynomial of the CRC16. The C code included below can be easily modified to generate a "syndrome table" for the new application provided that there exists a unique "syndrome table" for such an application.

Therefore, in accordance with a first aspect of the present invention there is provided a method of performing single bit error corrected M-bit words that have been scrambled using a self synchronizing scrambler, the method comprising the steps of: a) calculating an N-bit CRC every K words of a block of J words using a generator polynomial, where J is a non-zero integer multiple of K; b) forming an M-bit word from the calculated N-bit CRCs, where M is a non-zero integer multiple of N, and appending this word to the block of J words to form a block of J+1 words for transmission; c) calculating, responsive to receiving a block of J+1 words, another N-bit CRC every K words of the first J words of the received block of J+1 words and using, from the appended word, the N-bit CRC corresponding to the K words in each calculation; and d) correcting, responsive to one of the another N-bit CRCs having a non-zero value, an errored bit in the received block of J+1 words, the errored bit being indicated by an entry in a table indexed according to the non-zero value.

In accordance with a second aspect of the present invention there is provided an error control block receiver (ECB_Rx) for receiving and performing single bit error correction on M-bit words that have been scrambled using a self synchronizing scrambler comprising: synchronizing means to synchronize the error control block; a buffer to store the M-bit words in a tabular buffer; CRC 16 computation means to calculate a syndrome; and a syndrome table, the calculated syndrome being compared with the syndrome table to detect a single bit error.

In accordance with a further aspect of the present invention there is provided an error control block transmitter (ECB_Tx) for use in a single bit error correction on M-bit encoded words, the ECB_Tx comprising computation means to calculate CRC 16 of code words; a buffer to store the code words in a tabular buffer; and transmitting means to selectively transmit the code words.

Further advantages of the present invention will become apparent from the description of the preferred embodiment which follows.

BRIEF DESCRIPTION OF THE DRAWINGS

The invention, its organization, construction and operation will be best understood by reference to the following detailed description taken into conjunction with the accompanying drawings, in which:

FIG. 1 is a functional block diagram of the Physical Coding Sublayer (PCS).

FIG. 2 illustrates the possible values of the preamble bits in a 64b/66b code word.

FIGS. 3a and 3b are representations of the self-synchronous scrambler and descrambler respectively.

FIG. 4 is a graph of the probability of packet loss with and without single bit error connection.

FIGS. 5a & 5b are functional block diagrams of transmit and receive error control blocks.

FIG. 6 shows the buffer format in the transmit and receive blocks of FIGS. 5a and 5b; and FIG. 7 is a state diagram of the block synchronization in the receive module.

DETAILED DESCRIPTION OF THE INVENTION

Throughout the following description, specific details are set forth in order to provide a more thorough understanding of the invention; the invention, however, may be practiced without these particulars. In other instances, well known elements have not been shown or described in detail to avoid unnecessarily obscuring the invention. It is to be understood that the following description is merely illustrative of the principles of the invention and that other arrangements may be devised by those skilled in the art. The general principles defined herein may be applied to other embodiments and applications without departing from the spirit and scope of the present invention. Thus, the present invention is to be accorded the widest scope consistent with the principles and features disclosed herein.

As indicated previously the IEEE 802.3 has standardized 64b/66b encoding scheme in 10 Gigabit Ethernet, which provides an acceptable level of transmission density and run length. The IEEE 802.3 10G Ethernet standard, however, does not provision for error correction of 64b/66b encoded links.

FIG. 1 shows a functional block diagram of the PCS layer in the IEEE 802.3 10 GBASE-R Ethernet PHY (Physical Layer Device) model. The PCS uses a transmission code, which is the 64b/66b, to improve the transmission characteristics of information to be transferred across the link and to support the transmission of control and data characters. The encodings defined by the transmission code ensure that sufficient transitions are present in the PHY bit stream to make clock recovery possible at the receiver. The encoding also preserves the likelihood of detecting any single- or multiple-bit errors that may occur during transmission and reception of information. In addition, the synchronization headers of the code enable the receiver to achieve block alignment on the incoming PHY bit stream. The 64b/66btransmission code specified for use in this standard has a high transition density and is a runlength-limited code.

In the present invention, as shown in FIG. 1, new blocks, called the Error Control Block Transmit and Receive hereinafter referred to as ECB_Tx & ECB_Rx 22, 24, are added between the XGMII (10-Gigabit Media Independent Interface) and the PCS (Physical Coding Sublayer) in both directions—transmit and receive—28 and 30. The ECB added in the transmit direction and the one added in the receive direction—the transmit ECB and the receive ECB, respectively (ECB_Tx and ECB_Rx)—have different configurations as they have different functions.

At the transmission direction, the transmit ECB calculates CRC16 over every two codewords (as explained latter), and appends it to the data. At the receive direction, the receive ECB calculates the syndrome and uses a predefined table to correct single-bit errors, if any. Since error correction is performed at the receiver after the signal is descrambled, a single-bit error might be duplicated by the self-synchronous scrambler. The receive ECB module takes this fact into account when calculating the error syndrome. It performs single-bit error correction on 64b/66b encoded lines while taking into account the error duplication of the self-synchronous scrambler.

FIGS. 5a and 5b show the functional block diagram of the transmit ECB and receive ECB blocks respectively. Having explained the structure of the invention, the process accompanying the use of such structure will now be described. The details of each module—the transmit ECB and the receive ECB—will be described separately.

At the transmitter, the transmit ECB module 22 consists of a buffer 40 of nine codewords (each codeword is 64 bits—8 bytes). This buffer, called the transmit buffer, is shown in FIG. 6 and can be viewed as a 9×8 bytes matrix (nine rows with eight bytes—codewords—per row). The first eight rows of the transmit buffer are used to store eight codewords of data received from the XGMII. The last row of the transmit buffer, which also consists of eight bytes, is used to store four CRC16s each consisting of two bytes: CRC16-0,CRC16-1, CRC16-2,and CRC16-3.

The transmit ECB module 22 calculates CRC16 (42) over every two consecutive rows-codewords-of the transmit buffer and correspondingly stores the results in the last row. In other words, the eight bytes of the last row are respectively calculated from the eight codewords, which are stored in the top eight rows; the eight "calculated" bytes are then paired into four groups; and each group is stored in the corresponding CRC16.By the time the eight codewords are received and their corresponding CRC16s are calculated, the buffer is ready to be transmitted. (Since the last row is also eight bytes, the buffer is codeword-aligned; there is no need for boundary adjustment.)

The CRC16 generator polynomial used by the ECB module at the transmitter is the ITU-T polynomial: $x^{16}+x^{12}+x^5+1$. The C code to generate CRC16 is shown below.

The C code to generate CRC16 at the transmitter based on the ITU-T recommended polynomial ($x^{16} + x^{12} + x^{15} + 1$).
```
/**************************************************************
*/
typedef unsigned char u8;
typedef unsigned short u16;
```

-continued

```
u16 crc16_t8(u16 crcval)
{
    u16 f1,f2,f3;
    f1 = (crcval>>8) | (crcval<<8);
    f2 = (crcval>>12) | (crcval&0xF000) | ((crcval>>7)&0x01E0);
    f3 = ((crcval>>3) & 0x1FE0) ^ ((crcval<<4) & 0xF000);
    return f1^f2^f3;
}
u16 crc16_payload(u8 *buffer, int buf_len)
{
    u16 crc = 0;
    int i;
    for (i = 0; i < buf_len; i++)
        crc = crc16_t8(crc ^ (buffer[i]<<8));
    return crc;
}
/**************************************************************
*/
```

At the receiver, the receive ECB 24 module also consists of a 9×8 bytes buffer 46, called the receive buffer. The data received from the PCS are buffered in the receive buffer, and CRC16 (48) is calculated over every two consecutive rows—codewords—as well as the CRC corresponding to the two rows. If the resulting CRC is 0 (zero), no error has occurred, and the two codewords can be delivered to the XGMII. If CRC is not 0 (zero), it is an indication of one or more errors. The non-zero CRC is called the error syndrome. The "syndrome" will be compared against the "syndrome table," 50 which is shown in Table 1,to determine whether the error is correctable or not.

TABLE-1

The error syndrome table (SYND_TABLE) in ECB_RX module.

| 3604 | 1B02 | 0D81 | 8ED0 | 4768 | 23B4 | 11DA | 08ED |
|------|------|------|------|------|------|------|------|
| 8C66 | 4633 | AB09 | DD94 | 6ECA | 3765 | 93A2 | 49D1 |
| ACF8 | 567C | 2B3E | 159F | 82DF | C97F | ECAF | FE47 |
| F733 | F389 | F1D4 | 78EA | 3C75 | 962A | 4B15 | AD9A |
| 56CD | A376 | 51BB | A0CD | D876 | 6C3B | BE0D | D716 |
| 6B8B | BDD5 | D6FA | 6B7D | BDAE | 5ED7 | A77B | DBAD |
| E5C6 | 72E3 | B161 | D0A0 | 6850 | 3428 | 1A14 | 0D0A |
| 0685 | 8B52 | 45A9 | AAC4 | 5562 | 2AB1 | 9D48 | 4EA4 |
| 2752 | 13A9 | 81C4 | 40E2 | 2071 | 9828 | 4C14 | 260A |
| 1305 | 8192 | 40C9 | A874 | 543A | 2A1D | 9D1E | 4E8F |
| AF57 | DFBB | E7CD | FBF6 | 7DFB | B6ED | 5366 | 29B3 |
| 9CC9 | C674 | 633A | 319D | 90DE | 486F | AC27 | DE03 |
| E711 | FB98 | 7DCC | 3EE6 | 1F73 | 87A9 | CBC4 | 65E2 |
| 32F1 | 1168 | 08B4 | 045A | 022D | 8906 | 4483 | AA51 |
| DD38 | 6E9C | 374E | 1BA7 | 85C3 | CAF1 | ED68 | 76B4 |
| 3B5A | 1DAD | 86C6 | 4363 | A9A1 | DCC0 | 6E60 | 3730 |
| 1B98 | 0DCC | 06E6 | 0373 | 89A9 | CCC4 | 6662 | 3331 |
| 9188 | 48C4 | 2462 | 1231 | 8108 | 4084 | 2042 | 1021 |

If the syndrome is found in the syndrome table, a single-bit error has occurred; this error can be corrected. The index of the syndrome in the table identifies which bit is in error. The syndrome table consists of 18 rows and 8 columns. The 18 rows correspond to two codewords (16 bytes) plus their corresponding CRC16 (2 bytes). If the syndrome is found at row <i> and column <j> of the syndrome table, then it means that bit <j> of byte <i> is in error and can be corrected.

Since error correction is performed after the signal is descrambled, a single-bit error might be duplicated by the self-synchronous scrambler. This fact was taken into account when the syndrome table was generated. If the syndrome is not found in the table, then more than one error has occurred; these errors can not be corrected. The C code to generate the syndrome table is shown below:

```
#define NO_ERRORED_BIT 0xFE
#define MULTI_ERRORED_BITS 0xFF
#define CELL_BYTES 18 /* nbr of bytes in a cell including
                         2 bytes for CRC16. */
#define RAND_MAX 0xFF
/************************************************************/
void generate_error_table(u8 *bptab)
{
    u16 crc;
    int i, j, k;
    u8 buff1[CELL_BYTES - 2];
    u8 buff2 [CELL_BYTES];
    u8 original [CELL_BYTES];
    int dup_byte, dup_bit, trip_byte, trip_bit;
    // fill the buffer with random bytes.
    for (i=0; i < (CELL_BYTES - 2); i++)
        buff1[i] = (u8) rand( );
    crc = crc16_payload (buff1, CELL_BYTES-2);
    // attach CRC16 to the end of the buffer
    memcpy ((u8*)buff2, (u8*)buff1, (CELL_BYTES-2));
    buff2[CELL_BYTES-2] = (u8) (crc >> 8) & (0x00FF);
    buff2[CELL_BYTES-1] = (u8) (crc & 0x00FF);
    /* keep a copy of the original data. */
    memcpy ((u8*)original, (u8*)buff2, CELL_BYTES);
    /* make sure the CRC16 is correctly calculated and
       attached. */
    /*the CRC of the new buffer must be 0.*/
    crc = crc16_payload (buff2, CELL_BYTES);
    if (crc != 0)
    {
        printf ("\n ERROR: CRC is not correctly appended!
\n");
        exit (3);
    }
    // Now, generate the syndrom table.
    /* Marker for no error */
    bptab[0] = NO_ERRORED_BIT;
    /* Marker for >1 error */
    for (i = 1; i < 65536; i++ )
        bptab[i] = MULTI_ERRORED_BITS;
    /* Error correction is performed after the bit stream goes through
       de-scarmbler. we need to calculate syndromes while accounting
       for error duplication of x^58 self-synchronous scarmble. */
            printf("\n Error syndrome table, With error
                    multiplication: \n");
    for (i = 0; i < CELL_BYTES; i++)
    {
    putchar(' ');
    for (j = 0; j < 8; j++)
        {
        /* Take the original data. */
        memcpy ((u8*)buff2, (u8*)original,
CELL_BYTES);
        buff2 [i] ^= (0x80 >> j); // Corrupt 1 bit.
        if ( ((i*8)+j + 58 ) < (CELL_BYTES*8) )
            {
/* Error is duplicated twice inside the current cell. The error is
duplicated exactly 39 bit and 58 bit periods later, inside the current
cell. */
            dup_byte = ((i*8)+j + 39)/ 8;
            dup_bit = ((i*8)+j + 39) % 8;
            // Corrupt the bit at 39 bit period later.
            buff2 [dup_byte] ^= (0x80 >> dup_bit);
            trip_byte = ((i*8)+j +58)/ 8;
            trip_bit = ((i*8)+j + 58) % 8;
            // Corrupt the bit at 58 bit period later.
            buff2 [trip_byte] ^= (0x80 >> trip_bit);
            }
        else if ( ((i*8)+j + 39 ) < (CELL BYTES*8) )
            {
/* error is duplicated only once. A single-bit error is duplicated
exactly 39 bit period later, inside the current cell. */
            dup_byte = ((i*8)+j + 39)/ 8;
            dup_bit = ((i*8)+j + 39) % 8;
            // Corrupt the duplicated bit.
            buff2 [dup_byte] ^= (0x80 >> dup_bit);
            }
        // Calculate the syndrome.
        crc = crc16_payload (buff2, CELL_BYTES);
        printf (" %04X",crc);
        bptab[crc] = (i * 8) + j;
        } //for j
        putchar ('\n');
    }// for i
} /* generate_error_table /
/************************************************************/
```

Before any error correction, error detection, or both can be performed, the receive ECB module 24 needs to be synchronized. This synchronization 52 is necessary to build the matrix structure of the receive buffer 46, which is the same as the structure shown in FIG. 6.

FIG. 7 shows the state diagram of the block synchronizer. At the reset, the receive ECB is in hunt mode during which it stores the first 72 bytes of the received data in the receive buffer. (It should noted that 72 bytes is the size of each buffer—the transmit and the receive buffers—in whole.)

Subsequently, the block synchronizer 52 calculates the CRC16 over every two consecutive codewords in the buffer (the same as in its normal operation), and it compares it against the corresponding CRC16 stored in the last row of the buffer. If all of the four calculated CRCs match with the ones stored in the last row, the synchronization process is complete; otherwise, a sliding window with the size of one codeword is maintained (the first row of the receive buffer is discarded), all other codewords are shifted up by one row, and the new received codeword is stored at the last codeword-allocated row of the receive buffer.

Recursively, the CRC16 is calculated over every two consecutive codewords in the buffer and is compared against the corresponding CRC16 stored in the last row of the buffer. The process of "sliding window" is iterated until all of the four calculated CRCs match with the ones stored in the last row. This indicates that the synchronization process is complete.

The receive ECB is declared "out of synch" if more than N non-correctable blocks—blocks with more than one single-bit errors—are received. (N is a predefined number, usually in the range of 2 to 5.) After the receive ECB block is in "synch mode," it starts performing error correction.

To examine the performance of the error-connection scheme, an exhaustive test was run on 18 bytes of data—that is, two codewords (16 bytes) plus their corresponding CRC16 (2 bytes). The test verified that any pattern of single-bit error can be detected and corrected by the above syndrome table. It was also verified that any pattern of double-bit errors can be detected by CRC16; these errors, however, can not be corrected by the syndrome table. This ensures that the aforementioned algorithm does not see a double-bit error as a single-bit error and correct it by mistake (i.e., no mis-correction).

Furthermore, the proposed scheme is 64-bit aligned (requiring no boundary adjustments), and is compatible with the structure of 10GE defined in the IEEE 802.3 standard.

As in any error-connection scheme, which typically requires 8% to 15% overhead, the overhead of the proposed error correction scheme is two bytes (CRC) per every two codewords, which is 12.5%. The proposed scheme also introduces a negligible amount of latency (equivalent to 64 bytes) due to the buffers implemented in ECB_TX and ECB_RX modules.

By calculating the probability of frame loss, it can be shown that a single-bit error correction significantly enhances the quality of the link (for instance, from $10^{-12}$ to $10^{-20}$).

As discussed above and shown in FIG. 4 a single-bit error correction can significantly enhance the link quality. Furthermore, there has been no proposal of using CRC16 when the errors might be duplicated, for instance, in presence of a self-synchronous scrambler.

The present invention presents a simple and fast error correction scheme which can be used in conjunction with 64b/66b encoding in products where intra-board (chip-to-chip) or inter-shelf interconnections of high speed elements are required. This error correction scheme is not provided in the prior art discussed above and should be deemed as an inherent element in 64b/66b encoded links because of obvious reasons—the significant consequences that may arise from discounting certain errors.

I claim:

1. A method of performing single bit error correction on M-bit words that have been scrambled using a self synchronizing scrambler, the method comprising the steps of:
   a) calculating an N-bit CRC every K words of a block of J words using a generator polynomial, where J is a non-zero integer multiple of K;
   b) forming an M-bit word from the calculated N-bit CRCs, where M is a non-zero integer multiple of N, and appending the said M-bit word to the block of J words to form a block of J+1 words for transmission;
   c) calculating, responsive to receiving a block of J+1 words, another N-bit CRC every K words of the first J words of the received block of J+1 words and using, from the appended word, the N-bit CRC corresponding to the K words in each calculation; and
   d) correcting, responsive to one of the another N-bit CRCs, computed at a receiver, having a non-zero value, an errored bit in the received block of J+1 words, the errored bit being indicated by an entry in a table indexed according to the non-zero value.

2. The method as defined in claim 1 wherein the M-bit words are 64b/66b encoded words (M=64 bits).

3. The method as defined in claim 2 wherein the N-bit CRC is a 16 bit CRC.

4. The method as defined in claim 3 wherein K=2 and J=8.

5. The method as defined in claim 1 wherein the generator polynomial is $x^{16}+x^{12}+x^5+1$.

* * * * *